(12) United States Patent
Chen et al.

(10) Patent No.: US 7,786,029 B2
(45) Date of Patent: Aug. 31, 2010

(54) RESIN COMPOSITION AND APPLICATION THEREOF

(75) Inventors: Li-Chun Chen, Taoyuan (TW); Jeng-I Chen, Longtan Shiang (TW); Bill Weng, Taoyuan (TW)

(73) Assignee: ITEQ Corporation, Taoyuan (TW)

( * ) Notice: Subject to any disclaimer, the term of this patent is extended or adjusted under 35 U.S.C. 154(b) by 0 days.

(21) Appl. No.: 12/348,483

(22) Filed: Jan. 5, 2009

(65) Prior Publication Data

US 2009/0176104 A1      Jul. 9, 2009

(30) Foreign Application Priority Data

Jan. 4, 2008      (TW) .............................. 97100410 A

(51) Int. Cl.
*B32B 27/04*      (2006.01)
*B32B 17/02*      (2006.01)
*B32B 15/00*      (2006.01)

(52) U.S. Cl. ....................... 442/114; 428/901; 428/209; 442/110; 442/117; 442/172; 442/180

(58) Field of Classification Search .................. 442/110, 442/114, 117, 172, 180
See application file for complete search history.

(56) References Cited

U.S. PATENT DOCUMENTS

| | | | | |
|---|---|---|---|---|
| 6,645,631 | B2 * | 11/2003 | Gan et al. .................... | 428/413 |
| 2004/0158023 | A1 * | 8/2004 | Hwang et al. .................. | 528/87 |
| 2004/0166324 | A1 * | 8/2004 | Mishima et al. .............. | 428/413 |

* cited by examiner

*Primary Examiner*—Lynda Salvatore
(74) *Attorney, Agent, or Firm*—Muncy, Geissler, Olds & Lowe, PLLC

(57) ABSTRACT

A resin composition contains a solvent and a solid content dispersed in the solvent. The solid content does not contain phenolic resin. The solid content contains a benzoxazine resin and a phosphorus-containing epoxy resin. The weight ratio of the benzoxazine resin to phosphorus-containing epoxy resin is about 0.6:1 to about 3.0:1. A circuit board substrate and a copper clad laminate fabricated with the resin composition mentioned above are disclosed too.

14 Claims, 1 Drawing Sheet

RESIN COMPOSITION AND APPLICATION THEREOF

RELATED APPLICATIONS

This application claims priority to Taiwan Application Serial Number 97100410, filed Jan. 4, 2008, which is herein incorporated by reference

BACKGROUND

1. Field of Invention

The present invention relates to a composition. More particularly, the present invention relates to a resin composition.

2. Description of Related Art

Printing circuit board has been developed since several decades ago and widely applied in tremendous electronic products.

Conventional processes for manufacturing printing circuit board comprise steps of drilling and etching copper clad laminate with resin layer and copper foil to form conductive lines and via holes. In order to obtain high yield rate of manufacturing printing circuit board, thermal and mechanical properties of resin layer of the copper clad laminate have to meet specific requirements. Therefore, the development of quality resin composition for printing circuit board has been an important focus in this industry.

SUMMARY

According to one embodiment of this invention, a resin composition is provided. This resin composition comprises a solvent and a solid content dispersed in the solvent. The solid content contains phosphorus-containing epoxy resin and benzoxazine resin but does not contain phenolic resin. The weight ratio of benzoxazine resin to phosphorus-containing epoxy resin is 1.6:1~3.0:1.

According to another embodiment of this invention, a circuit board substrate is provided. The circuit board substrate comprises a reinforcing material and a cured resin that wraps the reinforcing material. The cured resin is solidified resin composition mentioned previously.

According to another embodiment of this invention, a copper clad laminate is provided. The cooper clad laminate contains aforementioned circuit board substrate and a copper foil. The copper foil is located on the top of the cured resin of the circuit board substrate.

The resin composition and copper clad laminate disclosed in embodiments of this invention are featured by better thermal property and dielectric loss than that of conventional resin composition and copper clad laminate made out of conventional resin composition.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
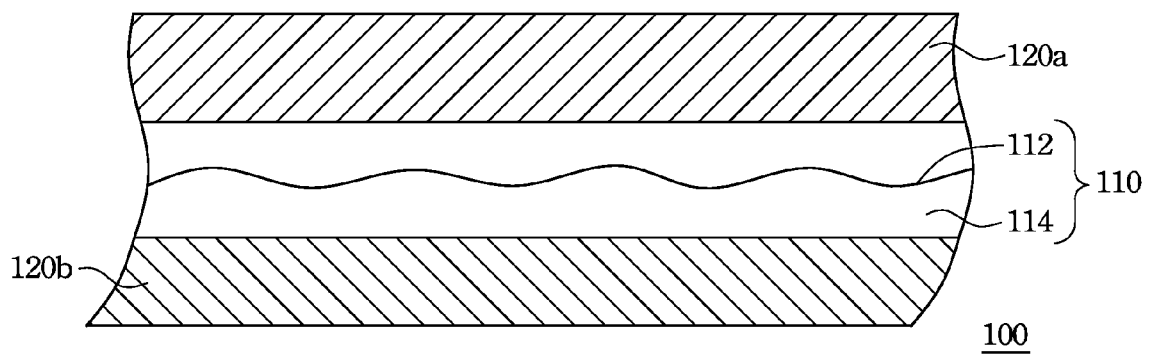
FIG. 1 is a cross-sectional view of a copper clad laminate according to an embodiment of this invention.

FIG. 1 is a cross-sectional view of a copper clad laminate according to an embodiment of this invention. In FIG. 1, cooper clad laminate 100 comprises a circuit board substrate 110, a cooper foil 120a and a cooper foil 120b. The circuit board substrate 110 comprises a reinforcing material 112 and a cured resin 114. The reinforcing material 112 is wrapped with the cured resin 114. The cooper foil 120a and the cooper foil 120b are on the opposite sides of the circuit board substrate 110.

The aforementioned cured resin is made by solidification of a resin composition. The resin composition comprises a solvent and a solid content dispersed in the solvent. The solid content does not contain phenolic resin so thermal property and fracture toughness of the cured resin can be higher. The solid content may contain phosphorus-containing epoxy resin and benzoxazine resin. The weight ratio of benzoxazine resin to phosphorus-containing epoxy resin is 1.6:1~3.0:1. More specifically, phosphorus-containing epoxy resin is about 20~50 wt % of the solid content and benzoxazine resin is about 30~60 wt % of the solid content.

The chemical formula of phosphorus-containing epoxy resin is structure I, chemical structure A and B in structure I are showed in structure II.

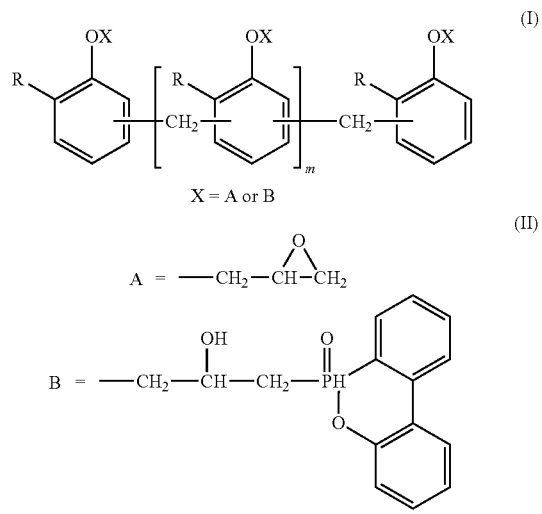

Benzoxazine resin has molecular weight about 800-1800, benzoxazine resin is a polymer with structure III or IV shown below.

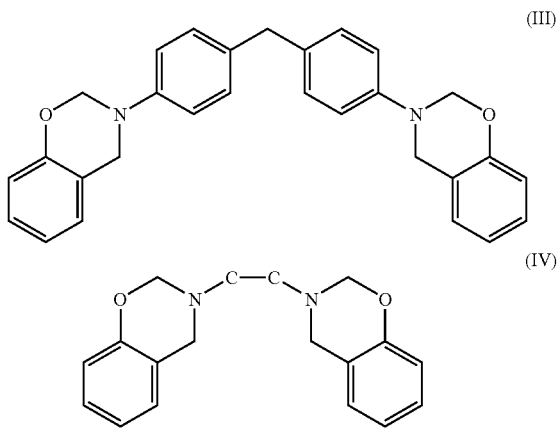

The above mentioned resin composition may further contain an inorganic filler, the inorganic filler can be, for example, silicon dioxide, aluminum hydroxide, magnesium hydroxide, talc powder or mica. The inorganic filler with amount less than 20 wt % of the solid content in the resin composition is used for providing resin composition proper viscosity to facilitate subsequent circuit board substrate 110 manufacturing.

Furthermore, in order to improve dispersion of the solid content in the solvent, a dispersant can be added to the resin composition. The dispersant can be, for example, a silane couple agent. A curing catalyst can also be added to the resin composition to catalyze solidification, the curing catalyst can be, for example, 2-MI(Z) (2-methylimidazole), 2-PI(Z), (2-phenylimida zole) or 2-E4MI(Z) (2-ethyl-4-methylimida zole).

EXAMPLES

According to above resin composition preparation method disclosed in the invention, phosphorus-containing epoxy resin, benzoxazine resin, curing catalyst 2-MI and DMF solvent (N,N-Dimethyl formamide) are mixed. The average molecular weight of benzoxazine resin is about 1000~1400, resin structure contains structure III. Phosphorus-containing epoxy resin is selected from LX6302 series products of Chin-Yee Chemical Industries Co., LTD.

The mixture is subsequently stirred with a stirrer, and a silane couple agent as a dispersant and an inorganic filler are added into the mixture to obtain resin composition. The solid content is about 65 wt % of the resin composition.

After finished the above resin composition preparation, the manufacturing of cooper clad laminate can be performed as follows: a glass fiber cloth is soaked in the resin composition, the glass fiber cloth is heat treated and hot pressed with copper to obtain double-sided cooper clad laminate or multiple-layer cooper clad laminate.

Subsequently, material properties such as water absorption, thermal property, peeling strength, dielectric property, combustion property, fracture toughness, are measured. Property measurement methods are described below.

Water absorption measurement is to place cooper clad laminate in a pressure chamber of 121° C. and 1.1 kgf/cm$^2$ for one hour and then measure the weight change of the copper clad laminate.

Thermal properties measurements include measurements of thermal stability, thermal decomposition temperature (Td), glass transition temperature (Tg) and thermal expansion properties. Thermal stability can be obtained by measuring peeling time of a multiple-layer cooper clad laminate in a tin oven of 288° C. Thermal decomposition temperature (Td) can be obtained, according to IPC-TM650 method, by the use of TGA to measure at what temperature the sample reaches 5 wt % loss. Glass transition temperature (Tg) can be measured by DSC according to IPC-TM650 method. Thermal expansion property can be obtained, according to IPC-TM650 method, by the use of TMA to measure thickness increase rate of cooper clad laminate when being heated from 50° C. to 260° C.

According to IPC-TM650, universal tensile testing instrument is used to measure adhesivity between cooper foil and circuit board substrate. Dielectric property is also measured by following IPC-TM650 method, and combustion property is measured by UL94 vertical flame test method.

The way to measure fracture toughness is to fix a jig similar to a Philips screw driver on the universal tensile testing instrument with 1 kN load cell. The initial distance between the tip of the jig and the copper clad laminate is 10 mm, and the tip of the jig is moving toward the copper clad laminate surface at a speed of 20 mm/min and stopped after moving 15 mm, then the indent generated on the surface of the copper clad laminate is analyzed.

Figure 2:
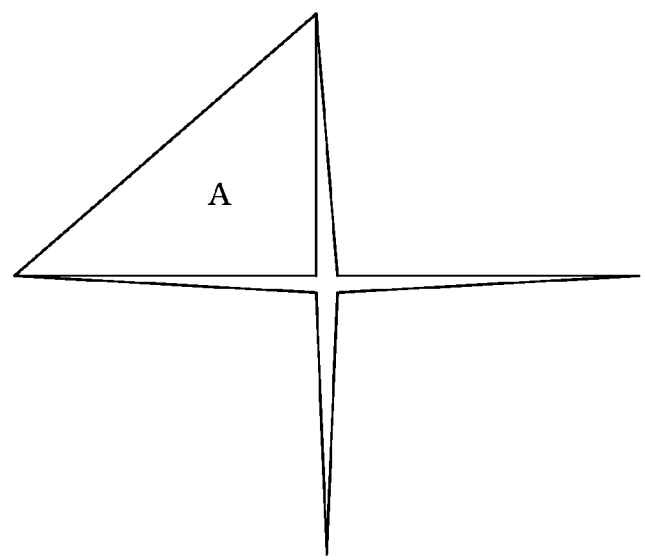
FIG. 2 is an indent produced during fracture toughness test according to an embodiment of this invention.

FIG. 2 is an indent produced during fracture toughness test according to an embodiment of this invention. The fracture toughness of the copper clad laminate can be quantitatively analyzed by the ratio of the fracture area. As shown in FIG. 2, the cross groove generated by fracture toughness test defines an A region, if the total fracture areas in A region divided by the area of A region is equal to or smaller than 20%, then the fracture toughness of the sample is indicated as "O"—good fracture toughness. If it is higher than 20%, then the fracture toughness is indicated as "X"—poor fracture toughness.

Property Analysis

Table 1 lists compositions of solid contents (E1~E6) according to above example, and compositions of the phenolic resin containing solid content of traditional resin compositions (R1~R3). Table 2 shows properties of resin compositions/cooper clad laminates which contain solid contents listed in Table 1.

TABLE 1 compositions of solid contents in resin composition.

| | Composition | | | | | | | | |
|---|---|---|---|---|---|---|---|---|---|
| | E1 | E2 | E3 | E4 | E5 | E6 | R1 | R2 | R3 |
| A. benzoxazine resin (wt %) | 59.8 | 47.9 | 47.9 | 35.1 | 35.1 | 26.9 | 49.8 | 41.6 | 20.8 |
| B. epoxy resin (wt %) | 21.6 | 33.3 | 33.3 | 45.7 | 45.7 | 53.7 | 22.2 | 34.7 | 60.6 |
| Weight ratio of resin A to resin B | 2.76 | 1.44 | 1.44 | 0.77 | 0.77 | 0.5 | 2.24 | 1.2 | 0.34 |
| Phenolic resin (wt %) | 0 | 0 | 0 | 0 | 0 | 0 | 11.6 | 10.4 | 5.2 |
| Aluminum hydroxide (wt %) | 15.5 | 11.5 | 4.2 | 0 | 16 | 16.1 | 15.9 | 13 | 13 |
| Silicon dioxide (wt %) | 0 | 4.2 | 11.5 | 16 | 0 | 0 | 0 | 0 | 0 |
| Curing catalyst (wt %) | 3.1 | 3.1 | 3.1 | 3.2 | 3.2 | 3.2 | 0.35 | 0.35 | 0.35 |
| Dispersant wt % of other solid content | 0.03 | 0.03 | 0.03 | 0.03 | 0.03 | 0.03 | 0.03 | 0.03 | 0.03 |

TABLE 2

| properties | | E1 | E2 | E3 | E4 | E5 | E6 | R1 | R2 | R3 |
|---|---|---|---|---|---|---|---|---|---|---|
| | properties of resin compositions/cooper clad laminates | | | | | | | | | |
| Water absorption (wt %) | | 0.22 | 0.24 | 0.24 | 0.24 | 0.24 | 0.29 | 0.26 | 0.27 | 0.34 |
| Thermal stability (min) | | 10 | 6 | 8 | 8 | 4 | 3 | 2 | 2 | 2 |
| Td (° C.) | | 380 | 391 | 390 | 384 | 373 | 366 | 369 | 365 | 360 |
| Tg (° C.) | | 208 | 188 | 186 | 177 | 175 | 160 | 170 | 164 | 155 |
| Thermal expansion rate (%) | | 2.14 | 2.48 | 2.47 | 2.63 | 2.62 | 2.95 | 2.71 | 2.92 | 3.19 |
| peeling strength (lb/in) | | 9.6 | 9.6 | 10.9 | 10.6 | 9.8 | 8.9 | 9.3 | 8.8 | 8.1 |
| Dielectric loss Df (1 GHz) | | 0.006 | 0.007 | 0.007 | 0.008 | 0.008 | 0.009 | 0.012 | 0.011 | 0.011 |
| Combustion property (UL94) | | V-0 | V-0 | V-0 | V-0 | V-0 | V-0 | V-0 | V-0 | V-0 |
| Fracture toughness test | Observed indentation | yes | yes | yes | yes | yes | yes | yes | yes | yes yes |
| | Good or poor fracture toughness | X | X | X | ○ | ○ | X | X | X | X |

Thermal expansion rate is thickness increase rate of cooper clad laminate when being heated from 50° C. to 260° C.

Please refer to Table 1 and Table 2, the fact that compositions E1~E5 lead to lower water absorption than do R1~R3 suggests great potential for E1~E5 to be used for manufacturing copper clad laminate. E6 has water absorption higher than R1~R2 but still lower than R3.

For thermal stability measurement, E1~E6 has laminate peeling times equal to or higher than 3 minutes, better than that of R1~R3. E3 has longer peeling time than E2, and E4 has longer peeling time than E5 indicate better thermal stability can be obtained when using silicon dioxide instead of aluminum hydroxide as inorganic filler.

For thermal decomposition temperature (Td), glass transition temperature (Tg) and thermal expansion properties measurement, thermal decomposition temperatures and glass transition temperatures of E1~E5 are higher than those of R1~R3, thermal expansion rates of E1~E5 are lower those of R1~R3. This suggests E1~E5 are more thermally stable and able to sustain high manufacturing and operational temperatures. As shown in Table 1 and Table 2, the lower benzoxazine resin to phosphorus-containing epoxy resin ratio (E6), the less thermal stability it will be, but still E6 has higher thermal stability than R3.

For dielectric property measurement, E1~E6 have lower dielectric loss coefficients (Df) than R1~R3, when copper clad laminate with low dielectric loss coefficient is applied on high frequency signal transmission, signal loss and signal interference can be reduced.

For peeling strength measurement, E1~-E6 according to the embodiment of this invention provide better adhesively properties between cooper foil and resin composition than do R1~R3. For combustion property measurement, E1~E6 are able to reach as high as V-0 level.

For fracture toughness measurement, cross-shaped indents are generated during the fracture toughness measurement process for every cooper clad laminate (E1-E6, R1~R3), so a certain level of fracture toughness for each measurement can be expected. But if the cross-shaped indents of E1~E6 and R1~R3 are compared, E4~E5 have relatively smaller fracture area, this suggests when the ratio of benzoxazine resin to phosphorus-containing epoxy resin is adjusted to about 0.77, the fracture toughness of the obtained cooper clad laminate can reach the level of "good".

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A resin composition, comprising:
a solvent; and
a solid content dispersed in the solvent, the solid content does not contain phenolic resin, and the solid content comprises:
a phosphorus-containing epoxy resin having the following formula

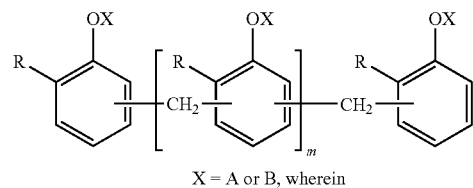

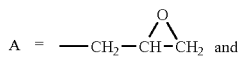

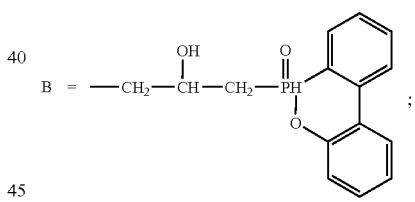

and
a benzoxazine resin having one of the following formula

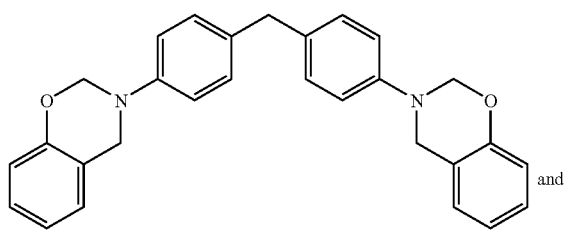
and
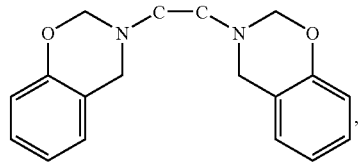
.

the weight ratio of the benzoxazine resin to the phosphorus-containing epoxy resin is about 0.6:1~3.0:1.

2. The resin composition of claim 1, wherein the phosphorus-containing epoxy resin is about 20~50 wt % of the solid content, the benzoxazine resin is about 30~60 wt % of the solid content.

3. The resin composition of claim 1, wherein the weight ratio of the benzoxazine resin to the phosphorus-containing epoxy resin is about 0.77.

4. The resin composition of claim 1, wherein the average molecular weight of the benzoxazine resin is about 800~1800.

5. The resin composition of claim 1, wherein the average molecular weight of the benzoxazine resin is about 1000~1400.

6. The resin composition of claim 1, further comprising an inorganic filler.

7. The resin composition of claim 6, wherein the inorganic filler is less than 26 wt % of the solid content.

8. The resin composition of claim 6, wherein the inorganic filler is selected from the group consisting of silicon dioxide, aluminum hydroxide, magnesium hydroxide, talc powder or mica.

9. The resin composition of claim 1, further comprising a dispersant, and the dispersant is a silane couple agent.

10. The resin composition of claim 1, further comprising a curing catalyst, the curing catalyst is selected from the group consisting of 2-methylimidazole, 2-phenylimidazole, or 2-ethyl-4-methylimidazole.

11. A circuit board substrate, comprises :
a reinforcing material; and
a cured resin wrapping the reinforcing material, the cured resin is obtained from solidification of the cured resin of claim 1.

12. The circuit board substrate of claim 11, wherein the reinforcing material is a glass fiber cloth.

13. A copper clad laminate, comprising:
a circuit board substrate, the circuit board substrate comprises:
a reinforcing material; and
a cured resin, wrapping the reinforcing material, the cured resin is obtained from solidification the cured resin of claim 1; and
a copper foil located on the top of the cured resin of the circuit board substrate.

14. The cooper clad laminate of claim 13, wherein the reinforcing material is glass fiber cloth.

* * * * *